United States Patent
Chen et al.

[11] Patent Number: 5,961,718
[45] Date of Patent: Oct. 5, 1999

[54] PROCESS FOR SELECTIVELY DEPOSITING DIAMOND FILMS

[75] Inventors: Chia-Fu Chen, Hsinchu; Sheng-Hsiung Chen, Taichung Hsien; Tsao-Ming Hong, Changhua Hsien, all of Taiwan

[73] Assignee: National Science Council, Taipei, Taiwan

[21] Appl. No.: 08/543,811

[22] Filed: Oct. 16, 1995

[51] Int. Cl.$^6$ ..................................................... C30B 29/04
[52] U.S. Cl. ................................ 117/94; 117/95; 117/97; 117/102; 117/929
[58] Field of Search ................................ 117/929, 95, 97, 117/94, 112

[56] References Cited

U.S. PATENT DOCUMENTS

| | | | |
|---|---|---|---|
| 5,219,769 | 6/1993 | Yonehara et al. | 437/35 |
| 5,420,443 | 5/1995 | Dreifus et al. | 257/77 |
| 5,433,977 | 7/1995 | Sarin et al. | 427/450 |
| 5,443,032 | 8/1995 | Vichr et al. | 117/84 |
| 5,497,726 | 3/1996 | Shikata et al. | 117/89 |
| 5,541,423 | 7/1996 | Hirabayashi | 257/77 |

OTHER PUBLICATIONS

Appl. Phys. Lett. 53 (19), Nov. 7, 1988 by Hirabayashi et al., entitled "Selective Deposition of Diamond Crystals by Chemical Vapor Deposition Using a Tungsten–Filament Method", pp. 1815–1817.

J. Mater, Res., vol. 7, No. 5, May 1992 by Ramesham et al., entitled "Selective Growth of Diamond Crystals on the Apex of Silicon Pyramids", pp. 1189–1194.

Thin Solid Films 206 (1991) by Ma et al., entitled "Large Area Diamond Selective Nucleation Based Epitaxy", pp. 192–197.

J. Appl. Phys. 74 (12), Dec. 15, 1993 by Shimada et al., entitled "Selective Growth of Diamond Uisng an Iron Catalyst", pp. 7228–7234.

Chen et al. (II), "Improvement of selectivity during diamond growth utilizing a new process", Journel of Applied Physics vol. 2 pp. 940–942, Jan. 15, 1995.

Chen et al. (II), "Study of the loss of pattern definition in diamond growth", Thin Solid Films, vol. 253 pp. 168–172, Dec. 1994.

*Primary Examiner*—Robert Kunemund
*Attorney, Agent, or Firm*—Frommer Lawrence & Haug LLP

[57] ABSTRACT

The present invention provides a process for selectively depositing diamond films, which includes two stages of diamond deposition and the gas source used is a mixture of $C_xH_y$ plus $CO_2$ or $C_xH_yO_z$ plus $CO_2$. In the period between the first and second stage, the substrate is immersed in an aqueous solution of HF plus $HNO_3$. The obtained diamond films exhibit good crystallinity and selectivity and the growth rate is fast.

23 Claims, 3 Drawing Sheets

60 μm

PROCESS FOR SELECTIVELY DEPOSITING DIAMOND FILMS

BACKGROUND OF THE INVENTION

1. Field of the Invention

The present invention generally relates to a process for selectively depositing diamond films, more particularly to a process for selectively depositing diamond films with the gas source of a mixture of $C_xH_y$ plus $CO_2$ or $C_xH_yO_z$ plus $CO_2$. The present process include two stages of diamond deposition. In the period between the first and second stage, the substrate is immersed in an aqueous solution of HF plus $HNO_3$ to increase the selectivity of diamond growth.

2. Description of the Prior Art

Diamond films are very suitable for semiconductor applications because of their excellent electrical properties such as wide band gap, high breakdown voltage and high hole mobility. However, a suitable mask material for patterning diamond is difficult to find, since an etchant solution which can etch diamond will also destroy the mask. Forming a diamond pattern by a chemical etching method is almost impossible.

Therefore, in recent years, the selective growth of diamond has been studied by many workers. For example, Hirabayashi et al. disclose a process for selectively growing diamond, which involves roughening a silicon substrate with diamond powders, selectively etching the diamond nuclei on the undesired region of the substrate by $Ar^+$ ion beam, and finally depositing diamond films (Appl. Phy. Lett. 53, 1815 (1988)).

However, the above process suffers from certain disadvantages, namely, the growth rate is slow, the crystallinity is poor and the diamond selectivity is not acceptable.

Therefore, it is an object of the present invention to solve the above-mentioned problems and to provide an improved process for selectively depositing diamond films. Depositing diamond films by the process of the present invention, results in a rapid growth rate and diamond films with good crystallinity and selectivity.

To achieve the above object, the process for selectively depositing diamond films of the present invention includes the steps of:

(a) forming an etch-resistant layer on the silicon substrate;

(b) removing part of the etch-resistant layer to form a predetermined pattern, thereby covering part of the substrate and exposing part of the substrate;

(c) forming diamond nucleation sites on the silicon substrate, thereby making the diamond nucleation density on the exposed part of the substrate substantially greater than the diamond nucleation density on the covered part of the substrate by several orders;

(d) removing the remainder of the etch-resistant layer;

(e) a first deposition stage: depositing diamond films on the silicon substrate with a gas mixture of hydrocarbon ($C_xH_y$) plus $CO_2$ or a gas mixture of oxygen-containing hydrocarbon ($C_xH_yO_z$) plus $CO_2$;

(f) immersing the silicon substrate in a hydrofluoric acid and nitric acid-containing aqueous solution to etch the diamond nuclei on the etch-resistant-layer-covering part of the silicon substrate; and (g) a second deposition stage: depositing a diamond film on the silicon substrate with a gas mixture of hydrocarbon ($C_xH_y$) plus $CO_2$ or a gas mixture of oxygen-containing hydrocarbon ($C_xH_yO_z$) plus $CO_2$.

According to one aspect of the present invention, the gas source for depositing diamond is a mixture of $C_xH_y$ (or $C_xH_yO_z$) plus $CO_2$, without the use of conventional used hydrogen. By using such a gas source, the diamond will have a faster growth rate and better crystallinity.

According to the second aspect of the present invention, the silicon substrate is immersed in a HF and $HNO_3$-containing aqueous solution in the period between the first and second stage of diamond deposition. By this procedure, the undesired region of the diamond nuclei will be etched, thus resulting in better diamond selectivity.

DETAILED DESCRIPTION OF THE INVENTION

Figure 1A:
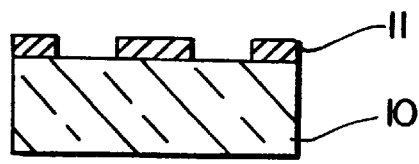
FIGS. 1A through 1D are schematic cross-sectional views depicting the process of selectively depositing diamond films of the present invention.
Figure 1B:
Figure 1C:
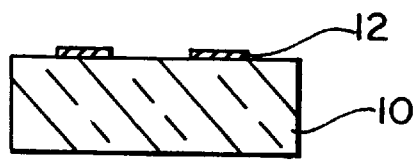

FIGS. 1A through 1D are schematic cross-sectional views depicting the process of selectively depositing diamond films of the present invention. Referring first to FIG. 1A, an etch-resistant layer 11 is formed on a cleaned silicon substrate 10 with a predetermined pattern through the use of ordinary photolithographic masking techniques. The etch-resistant layer can be a positive photoresist, a negative photoresist or silicon dioxide.

Next, the silicon substrate is roughened to form diamond nucleation sites, which can be achieved by immersing the substrate into diamond powders-containing water with ultrasonic agitation or by an ion implantation step. Since the etch-resistant layer can serve as a masking layer, by either of the above steps, different diamond nucleation density on the substrate will result, that is, the diamond nucleation density on the region uncovered by the etch-resistant layer is substantially greater than that on the region covered by the etch-resistant layer by several orders. Accordingly, in the subsequent deposition, diamond can be grown in a selective way, that is, more diamond particles will be deposited on the uncovered region of the substrate than on the covered region of the substrate.

The term "covered region" or "undesired region" hereinafter refers to the region of the substrate covered by the etch-resistant layer after the etch-resistant layer has been patterned. The term "uncovered region" or "exposed region" hereinafter refers to the region of the substrate uncovered by the etch-resistant layer after the etch-resistant layer has been patterned.

If the agitation time is too long, the etch-resistant layer may be incapable of protecting the undesired region (covered region) of the substrate from being deposited, thus the diamond particles can even be grown on the undesired region, thereby resulting in poor selectivity. Therefore, the agitation time should not be too long. In the case of diamond powders of 1–2 μm in diameter, the substrate is preferably immersed in the diamond powder-containing water for less than 60 minutes, more preferably for a period between 10 and 40 minutes.

After removing the residual etch-resistant layer (see FIG. 1B), the substrate 10 is then subjected to the first stage of diamond deposition. Since the diamond nucleation density on the exposed region of the substrate is larger than that on the covered region, when the substrate with different nucleation density is contacted by the gas source of a mixture of $C_xH_y$—$CO_2$, continuous diamond films 12 will be grown on the exposed region of the substrate (see FIG. 1C).

In addition to $C_xH_y$ plus $CO_2$, the gas source suitable for use in the deposition of the present invention can also be $C_xH_yO_z$ plus $CO_2$. The reactant gas source for diamond deposition of this invention contains no conventional used hydrogen gas, which is the first aspect of the present invention. The flow rate of the $C_xH_y$ (or $C_xH_yO_z$) to $CO_2$ should preferably be in the range of between 0.3 and 1.7. The substrate temperature for depositing diamond is between 200 and 900° C.

To increase the diamond selectivity, before the second stage of diamond deposition, according to the second aspect of the present invention, the first-stage-deposited substrate is immersed in an aqueous solution containing hydrofluoric acid (HF) and nitric acid ($HNO_3$). Upon such immersion, the undesired diamond particles on the covered region of the substrate will be etched and removed. In addition, the silicon surface will be reacted with nitric acid solution to form an oxidation layer, thus, when the substrate is subjected to the second stage of diamond deposition, the oxidation layer formed will inhibit the covered region of the substrate from being deposited. Accordingly, the diamond selectivity can be increased.

In the mixed solution of hydrofluoric acid and nitric acid, the volume of nitric acid should be greater than that of hydrofluoric acid, thus enabling excess nitric acid to react with silicon substrate to form oxidation layers. The volume ratio of hydrofluoric acid to nitric acid should preferably be between 1.05 and 2.0.

The longer the immersion time of the substrate into the aqueous solution containing HF and $HNO_3$ is, the less diamond particles on the undesired region can be obtained, thus resulting in better selectivity. The immersion time should preferably be greater than 20 seconds, more preferably between 20 and 100 seconds.

Figure 1D:
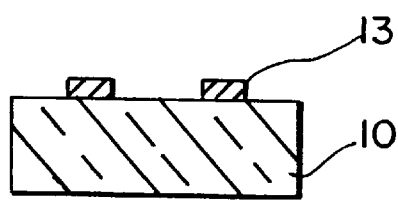

After being immersed in the HF and $HNO_3$-containing solution, the substrate is subjected to the second stage of diamond deposition according to the same conditions as in the first stage of deposition to obtain the desired thickness of diamond films 13 (see FIG. 1D). Since the substrate has been immersed in the mixed solution of hydrofluoric acid and nitric acid, during the second stage of deposition, diamond particles can hardly be grown on the undesired region (covered region), thus the diamond selectivity is greatly increased.

The following specific examples are intended to demonstrate this invention more fully without acting as a limitation upon its scope, since numerous modifications and variations will be apparent to those skilled in the art.

EXAMPLES 1

A p-type silicon wafer with (100) orientation and a resistivity smaller than 20 $\Omega$-cm was used. The silicon wafer was chemically cleaned and a circular photoresist pattern was formed on the wafer through the use of ordinary photolithographic masking techniques. Next, the silicon wafer was immersed in water containing diamond powders (with a diameter of 1–2 $\mu$m) by ultrasonic agitation for 30 minutes.

Figure 2A:
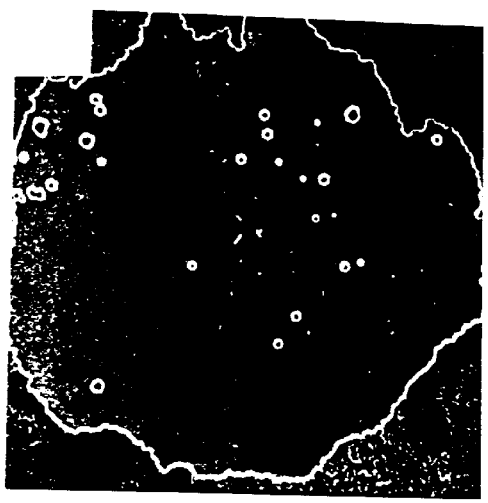
FIG. 2A is a SEM image of the surface of the diamond films obtained from Example 1.

Acetone was used to remove the residual photoresist pattern. Afterwards, the wafer was deposited using the gas source of $CH_4$—$CO_2$. The reactant gas pressure was set at 3.3 kPa (25 Torr). An optical pyrometer was used to monitor the substrate temperature, which was maintained at about 850° C. by keeping the microwave power at 450 W. The flow rates of $CO_2$ and $CH_4$ were fixed at 30 sccm and 19.2 sccm respectively. The total deposition time was 25 minutes. The SEM of the surface of the obtained diamond films is shown in FIG. 2A.

EXAMPLE 2

Figure 2B:
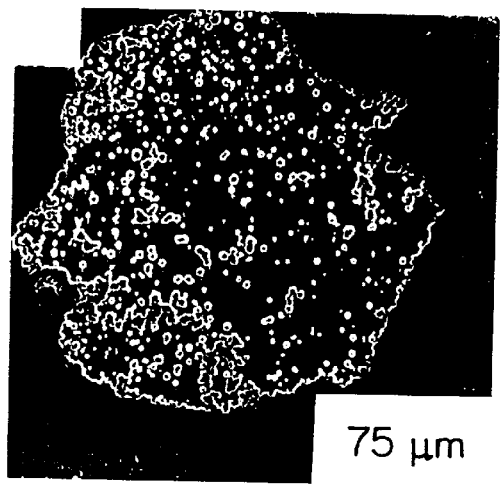
FIG. 2B is a SEM image of the surface of the diamond films obtained from Example 2.

The same procedures were employed as described in Example 1, except that the ultrasonic agitation time was varied to be as 60 minutes. The SEM of the surface of the obtained diamond films is shown in FIG. 2B. It is found that diamond particles can even be grown on the undesired region (circular region). Comparing FIG. 2A with FIG. 2B, it can be concluded that if the ultrasonic agitation time is too long, for example, up to 60 minutes in this example, the photoresist probably can not protect the undesired region (circular region) of the silicon surface from being roughened by diamond powders, which in turn results in a higher selectivity loss.

EXAMPLE 3

A silicon wafer of the same type used in Example 1 was chemically cleaned and a counter-circular photoresist pattern was formed on the wafer through the use of ordinary photolithographic masking techniques (photoresist is formed on the outside region of the circle). Next, the silicon wafer was immersed in water containing diamond powders (with a diameter of 1–2 $\mu$m) by ultrasonic agitation for 30 minutes.

Acetone was used to remove the residual photoresist pattern. Afterwards, the wafer was subjected to the first stage of diamond deposition using the gas source of $CH_4$—$CO_2$. All the deposition conditions were the same as described in Example 1.

Figure 3A:
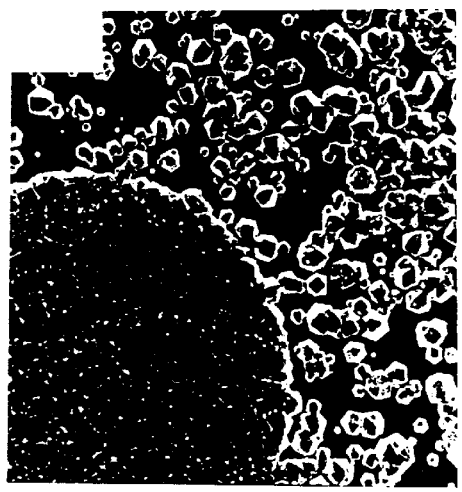
FIGS. 3A through 3C are SEM images of the surface of the diamond films obtained from Example 4.
Figure 3B:
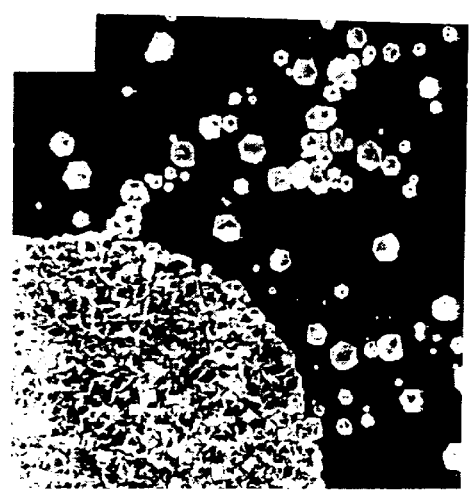
Figure 3C:
Figure 3D:
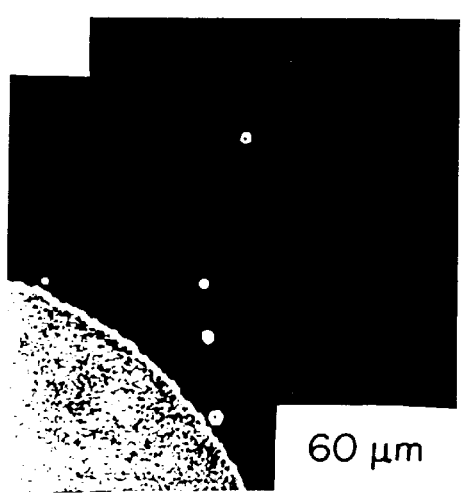
FIG. 3D is a SEM image of the surface of the diamond films obtained from Example 3.

To increase the degree of selectivity, before the second stage of diamond deposition, the wafer with selective diamond nucleation was immersed in an aqueous solution containing HF and $HNO_3$ (the volume ratio of HF:$HNO_3$:$H_2O$=1:1.1:10) for 60 seconds. Finally, the wafer was removed from the solution and was subjected to the second diamond deposition with the same deposition condition as used in Example 1. The second deposition time was 1.5 hours. The SEM image of the surface of the diamond films finally obtained is shown in FIG. 3D, demonstrating that the diamond films obtained exhibit excellent crystallinity and selectivity.

EXAMPLE 4

The same procedures were employed as described in Example 3, except that the wafer was immersed in the aqueous solution containing HF and $HNO_3$ for a period of 0, 20 and 50 seconds respectively. The SEM images of the surface of the obtained diamond films are shown in FIGS. 3A, 3B and 3C respectively.

Comparing FIGS. 3A through 3D, it is found that the longer the immersion time of the substrate in the aqueous solution containing HF and $HNO_3$, the less diamond particles on the undesired region (outside region of the circle) can be obtained, thus demonstrating better selectivity.

What is claimed is:

1. A process for selectively depositing diamond films on a silicon substrate, comprising the steps of:
   (a) forming an etch-resistant layer on the silicon substrate;
   (b) removing part of the etch-resistant layer to form a predetermined pattern, thereby covering part of the substrate and exposing part of the substrate;
   (c) forming diamond nucleation sites on the silicon substrate, thereby making the diamond nucleation density on the exposed part of the substrate substantially greater than the diamond nucleation density on the covered part of the substrate;
   (d) removing the remainder of the etch-resistant layer;
   (e) a first deposition stage: depositing diamond films on the silicon substrate with a gas mixture of hydrocarbon ($C_xH_y$) plus $CO^2$ or a gas mixture of oxygen-containing hydrocarbon ($C_xH_yO_z$) plus $CO_2$;
   (f) immersing the silicon substrate in a hydrofluoric acid and nitric acid-containing aqueous solution to etch the diamond nuclei on the covered part of the substrate, wherein the covered part of the substrate is previously covered by the etch-resistant layer in step (b); and
   (g) a second deposition stage: depositing a diamond film on the silicon substrate with a gas mixture of hydrocarbon ($C_xH_y$) plus $CO_2$ or a gas mixture of oxygen-containing hydrocarbon ($C_xH_yO_z$) plus $CO_2$.

2. The process as claimed in claim 1, wherein the etch-resistant layer is a photoresist or silicon dioxide.

3. The process as claimed in claim 1, wherein step (c) is immersing the silicon substrate into a diamond powder-containing water by ultrasonic agitation.

4. The process as claimed in claim 1, wherein step (c) is damaging the silicon substrate by ion implantation step.

5. The process as claimed in claim 3, wherein the diamond powders have a diameter of 1–2 $\mu$m.

6. The process as claimed in claim 5, wherein the ultrasonic agitation time is below 60 minutes.

7. The process as claimed in claim 6, wherein the ultrasonic agitation time is 10–40 minutes.

8. The process as claimed in claim 7, wherein the ultrasonic agitation time is 30 minutes.

9. The process as claimed in claim 1, wherein, in steps (e) and (g), the substrate temperature is 850° C.

10. The process as claimed in claim 1, wherein, in steps (e) and (g), the flow rate ratio of $C_xH_y$ to $CO_2$ is between 0.3 and 1.7.

11. The process as claimed in claim 1, wherein, in steps (e) and (g), the flow rate ratio of $C_xH_yO_z$ to $CO_2$ is between 0.3 and 1.7.

12. The process as claimed in claim 1, wherein, in steps (e) and (g), the $C_xH_y$ is methane.

13. The process as claimed in claim 12, wherein the flow rate ratio of methane to $CO_2$ is between 0.3 and 1.7.

14. The process as claimed in claim 13, wherein the flow rate ratio of methane to $CO_2$ is 0.64.

15. The process as claimed in claim 12, wherein the flow rate of $CO_2$ is 30 $cm^3min^{-1}$.

16. The process as claimed in claim 15, wherein the flow rate of methane is between 1 and 100 $cm^3min^{-1}$.

17. The process as claimed in claim 16, wherein the flow rate of methane is 19.2 $cm^3min^{-1}$.

18. The process as claimed in claim 1, wherein, in step (f), the volume ratio of nitric acid to hydrofluoric acid is larger than 1.

19. The process as claimed in claim 18, wherein the volume ratio of nitric acid to hydrofluoric acid is between 1.05 and 2.0.

20. The process as claimed in claim 19, wherein the volume ratio of nitric acid to hydrofluoric acid is 1.1.

21. The process as claimed in claim 1, wherein, in step (f), the immersion time is longer than 20 seconds.

22. The process as claimed in claim 21, wherein the immersion time is 20 to 100 seconds.

23. The process as claimed in claim 22, wherein the immersion time is 60 seconds.

\* \* \* \* \*